United States Patent
Lin et al.

(10) Patent No.: US 11,138,497 B2
(45) Date of Patent: Oct. 5, 2021

(54) IN-MEMORY COMPUTING DEVICES FOR NEURAL NETWORKS

(71) Applicant: Macronix International Co., Ltd., Hsinchu (TW)

(72) Inventors: Yu-Hsuan Lin, Taichung (TW); Chao-Hung Wang, Tainan (TW); Ming-Hsiu Lee, Hsinchu (TW)

(73) Assignee: MACRONIX INTERNATIONAL CO., LTD, Hsinchu (TW)

(*) Notice: Subject to any disclaimer, the term of this patent is extended or adjusted under 35 U.S.C. 154(b) by 279 days.

(21) Appl. No.: 16/224,602

(22) Filed: Dec. 18, 2018

(65) Prior Publication Data

US 2020/0026991 A1 Jan. 23, 2020

Related U.S. Application Data

(60) Provisional application No. 62/698,982, filed on Jul. 17, 2018.

(51) Int. Cl.
*G06N 3/063* (2006.01)
*G11C 11/54* (2006.01)
(Continued)

(52) U.S. Cl.
CPC ............ *G06N 3/063* (2013.01); *G11C 7/1006* (2013.01); *G11C 11/54* (2013.01); *G11C 27/005* (2013.01)

(58) Field of Classification Search
CPC .... G06N 3/063; G06N 3/0454; G11C 7/1006; G11C 27/005; G11C 11/54; G11C 13/0002; G11C 2213/77; G11C 5/025
See application file for complete search history.

(56) References Cited

U.S. PATENT DOCUMENTS 4,219,829 A 8/1980 Dorda et al.
4,987,090 A 1/1991 Hsu et al.
(Continued)

FOREIGN PATENT DOCUMENTS

CN 1998012 B 11/2010
CN 105718994 A 6/2016
(Continued)

OTHER PUBLICATIONS

EP Extended Search Report from 18155279.5-1203 dated Aug. 30, 2018, 8 pages.
(Continued)

*Primary Examiner* — Tri M Hoang
(74) *Attorney, Agent, or Firm* — Haynes Beffel & Wolfeld LLP

(57) ABSTRACT

An in-memory computing device includes a plurality of synaptic layers including a first type of synaptic layer and a second type of synaptic layer. The first type of synaptic layer comprises memory cells of a first type of memory cell and the second type of synaptic layer comprises memory cells of a second type, the first type of memory cell being different than the second type of memory cell. The first and second types of memory cells can be different types of memories, have different structures, different memory materials, and/or different read/write algorithms, any one of which can result in variations in the stability or accuracy of the data stored in the memory cells.

20 Claims, 11 Drawing Sheets

(51) Int. Cl.
  *G11C 27/00* (2006.01)
  *G11C 7/10* (2006.01)

(56) References Cited

U.S. PATENT DOCUMENTS

| | | |
|---|---|---|
| 5,029,130 A | 7/1991 | Yeh |
| 5,586,073 A | 12/1996 | Hiura et al. |
| 6,107,882 A | 8/2000 | Gabara et al. |
| 6,313,486 B1 | 11/2001 | Kencke et al. |
| 6,829,598 B2 | 12/2004 | Milev |
| 6,906,940 B1 | 6/2005 | Lue |
| 6,960,499 B2 | 11/2005 | Nandakumar et al. |
| 7,089,218 B1 | 8/2006 | Visel |
| 7,368,358 B2 | 5/2008 | Ouyang et al. |
| 7,436,723 B2 | 10/2008 | Rinerson et al. |
| 7,747,668 B2 | 6/2010 | Nomura et al. |
| 8,203,187 B2 | 6/2012 | Lung et al. |
| 8,275,728 B2 | 9/2012 | Pino |
| 8,432,719 B2 | 4/2013 | Lue |
| 8,589,320 B2 | 11/2013 | Breitwisch et al. |
| 8,630,114 B2 | 1/2014 | Lue |
| 8,725,670 B2 | 5/2014 | Visel |
| 8,860,124 B2 | 10/2014 | Lue et al. |
| 9,064,903 B2 | 6/2015 | Mitchell et al. |
| 9,147,468 B1 | 9/2015 | Lue |
| 9,213,936 B2 | 12/2015 | Visel |
| 9,379,129 B1 | 6/2016 | Lue et al. |
| 9,391,084 B2 | 7/2016 | Lue |
| 9,430,735 B1 | 8/2016 | Vali et al. |
| 9,431,099 B2 | 8/2016 | Lee et al. |
| 9,524,980 B2 | 12/2016 | Lue |
| 9,535,831 B2 | 1/2017 | Jayasena et al. |
| 9,536,969 B2 | 1/2017 | Yang et al. |
| 9,589,982 B1 | 3/2017 | Cheng et al. |
| 9,698,156 B2 | 7/2017 | Lue |
| 9,698,185 B2 | 7/2017 | Chen et al. |
| 9,710,747 B2 | 7/2017 | Kang et al. |
| 9,747,230 B2 | 8/2017 | Han et al. |
| 9,754,953 B2 | 9/2017 | Tang et al. |
| 9,767,028 B2 | 9/2017 | Cheng et al. |
| 9,898,207 B2 | 2/2018 | Kim et al. |
| 9,910,605 B2 | 3/2018 | Jayasena et al. |
| 9,978,454 B2 | 5/2018 | Jung |
| 9,983,829 B2 | 5/2018 | Ravimohan et al. |
| 9,991,007 B2 | 6/2018 | Lee et al. |
| 10,037,167 B2 | 7/2018 | Kwon et al. |
| 10,056,149 B2 | 8/2018 | Yamada et al. |
| 10,073,733 B1 | 9/2018 | Jain et al. |
| 10,157,012 B2 | 12/2018 | Kelner et al. |
| 10,175,667 B2 | 1/2019 | Bang et al. |
| 10,242,737 B2 | 3/2019 | Lin et al. |
| 10,528,643 B1 | 1/2020 | Choi et al. |
| 10,534,840 B1 | 1/2020 | Petti |
| 10,643,713 B1 | 5/2020 | Louie et al. |
| 10,825,510 B2 | 11/2020 | Jaiswal et al. |
| 10,860,682 B2 | 12/2020 | Knag et al. |
| 2003/0122181 A1 | 7/2003 | Wu |
| 2005/0287793 A1 | 12/2005 | Blanchet et al. |
| 2010/0182828 A1 | 7/2010 | Shima et al. |
| 2010/0202208 A1 | 8/2010 | Endo et al. |
| 2011/0063915 A1 | 3/2011 | Tanaka et al. |
| 2011/0106742 A1 | 5/2011 | Pino |
| 2011/0128791 A1 | 6/2011 | Chang et al. |
| 2011/0286258 A1 | 11/2011 | Chen et al. |
| 2011/0297912 A1 | 12/2011 | Samachisa et al. |
| 2012/0007167 A1 | 1/2012 | Hung et al. |
| 2012/0044742 A1 | 2/2012 | Narayanan |
| 2012/0182801 A1 | 7/2012 | Lue |
| 2012/0235111 A1 | 9/2012 | Osano et al. |
| 2012/0254087 A1 | 10/2012 | Visel |
| 2013/0070528 A1 | 3/2013 | Maeda |
| 2013/0075684 A1 | 3/2013 | Kinoshita et al. |
| 2014/0063949 A1 | 3/2014 | Tokiwa |
| 2014/0119127 A1 | 5/2014 | Lung et al. |
| 2014/0149773 A1 | 5/2014 | Huang et al. |
| 2014/0268996 A1 | 9/2014 | Park |
| 2014/0330762 A1 | 11/2014 | Visel |
| 2015/0008500 A1 | 1/2015 | Fukumoto et al. |
| 2015/0171106 A1 | 6/2015 | Suh |
| 2015/0199126 A1 | 7/2015 | Jayasena et al. |
| 2015/0331817 A1 | 11/2015 | Han et al. |
| 2016/0141337 A1 | 5/2016 | Shimabukuro et al. |
| 2016/0181315 A1 | 6/2016 | Lee et al. |
| 2016/0232973 A1 | 8/2016 | Jung |
| 2016/0247579 A1 | 8/2016 | Ueda et al. |
| 2016/0308114 A1 | 10/2016 | Kim et al. |
| 2016/0336064 A1 | 11/2016 | Seo et al. |
| 2016/0358661 A1 | 12/2016 | Vali et al. |
| 2017/0003889 A1 | 1/2017 | Kim et al. |
| 2017/0025421 A1 | 1/2017 | Sakakibara et al. |
| 2017/0092370 A1 | 3/2017 | Harari |
| 2017/0123987 A1 | 5/2017 | Cheng et al. |
| 2017/0148517 A1 | 5/2017 | Harari |
| 2017/0160955 A1 | 6/2017 | Jayasena et al. |
| 2017/0169885 A1 | 6/2017 | Tang et al. |
| 2017/0169887 A1 | 6/2017 | Widjaja |
| 2017/0263623 A1 | 9/2017 | Zhang et al. |
| 2017/0270405 A1 | 9/2017 | Kurokawa |
| 2017/0309634 A1 | 10/2017 | Noguchi et al. |
| 2017/0316833 A1 | 11/2017 | Ihm et al. |
| 2017/0317096 A1 | 11/2017 | Shin et al. |
| 2017/0337466 A1 | 11/2017 | Bayat et al. |
| 2018/0121790 A1 | 5/2018 | Kim et al. |
| 2018/0129424 A1 | 5/2018 | Confalonieri et al. |
| 2018/0144240 A1* | 5/2018 | Garbin ................ G06N 3/063 |
| 2018/0157488 A1 | 6/2018 | Shu et al. |
| 2018/0173420 A1 | 6/2018 | Li et al. |
| 2018/0189640 A1* | 7/2018 | Henry ................ G06F 9/3001 |
| 2018/0240522 A1 | 8/2018 | Jung |
| 2018/0246783 A1 | 8/2018 | Avraham et al. |
| 2018/0286874 A1 | 10/2018 | Kim et al. |
| 2018/0342299 A1 | 11/2018 | Yamada et al. |
| 2018/0350823 A1 | 12/2018 | Or-Bach et al. |
| 2019/0019564 A1 | 1/2019 | Li et al. |
| 2019/0035449 A1 | 1/2019 | Saida et al. |
| 2019/0043560 A1 | 2/2019 | Sumbul et al. |
| 2019/0065151 A1 | 2/2019 | Chen et al. |
| 2019/0102170 A1 | 4/2019 | Chen et al. |
| 2019/0148393 A1 | 5/2019 | Lue |
| 2019/0164044 A1* | 5/2019 | Song ................ G11C 11/54 |
| 2019/0213234 A1 | 7/2019 | Bayat et al. |
| 2019/0220249 A1 | 7/2019 | Lee et al. |
| 2019/0244662 A1 | 8/2019 | Lee et al. |
| 2019/0286419 A1 | 9/2019 | Lin et al. |
| 2019/0311749 A1* | 10/2019 | Song ................ G11C 16/045 |
| 2019/0325959 A1* | 10/2019 | Bhargava ........... G11C 14/0081 |
| 2019/0363131 A1* | 11/2019 | Torng ................ H01L 45/08 |
| 2020/0026993 A1 | 1/2020 | Otsuka |
| 2020/0065650 A1 | 2/2020 | Tran et al. |
| 2020/0110990 A1 | 4/2020 | Harada |
| 2020/0160165 A1 | 5/2020 | Sarin |
| 2020/0334015 A1 | 10/2020 | Shibata et al. |

FOREIGN PATENT DOCUMENTS

| | | |
|---|---|---|
| CN | 105789139 A | 7/2016 |
| CN | 106530210 A | 3/2017 |
| EP | 2048709 A2 | 4/2009 |
| TW | 201523838 A | 6/2015 |
| TW | 201618284 A | 5/2016 |
| TW | 201639206 A | 11/2016 |
| TW | 201732824 A | 9/2017 |
| TW | 201741943 A | 12/2017 |
| TW | 201802800 A | 1/2018 |
| TW | 201822203 A | 6/2018 |
| WO | 2012009179 A1 | 1/2012 |
| WO | 2012015450 A1 | 2/2012 |
| WO | 2016060617 A1 | 4/2016 |

(56) References Cited

FOREIGN PATENT DOCUMENTS

| | | |
|---|---|---|
| WO | 2017091338 A1 | 6/2017 |
| WO | 2018201060 A1 | 11/2018 |

OTHER PUBLICATIONS

EP Extended Search Report from EP18158099.4 (corresponding to MXIC 2230) dated Sep. 19, 2018, 8 pages.

Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.

Kim et al. "Multi-Layered Vertical Gate NAND Flash Overcoming Stacking Limit for Terabit Density Storage," 2009 Symposium on VLSI Technology Digest of Papers, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187. (cited in parent—copy not provided herewith).

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., "Neuromorphic Computing: From Materials to Systems Architecture," US Dept. of Energy, Oct. 29-30, 2015, Gaithersburg, MD, 40 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka H., et al., "Bit Cost Scalable Technology with Punch and Plug Process for Ultra High Density Flash Memory," 2007 Symp. VLSI Tech., Digest of Tech. Papers, pp. 14-15.

U.S. Office Action in U.S. Appl. No. 15/887,166 dated Jul. 10, 2019, 18 pages.

U.S. Office Action in U.S. Appl. No. 15/887,166 dated Jan. 30, 2019, 18 pages.

U.S. Office Action in U.S. Appl. No. 15/922,359 dated Jun. 24, 2019, 8 pages.

U.S. Office Action in related case U.S. Appl. No. 15/873,369 dated May 9, 2019, 8 pages.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

Anonymous, "Data in the Computer", May 11, 2015, pp. 1-8, https://web.archive.org/web/20150511143158/https:// homepage.cs. uri.edu/faculty/wolfe/book/Readings/Reading02.htm (Year: 2015)—See Office Action dated Aug. 17, 2020 in U.S. Appl. No. 16/279,494 for relevance—no year provided by examiner.

Rod Nussbaumer, "How is data transmitted through wires in the computer?", Aug. 27, 2015, pp. 1-3, https://www.quora.com/ How-is-data-transmitted-through-wires-in-the-computer (Year: 2015)—See Office Action dated Aug. 17, 2020 in U.S. Appl. No. 16/279,494 for relevance—no year provided by examiner.

Scott Thornton, "What is DRAm (Dynamic Random Access Memory) vs SRAM?", Jun. 22, 2017, pp. 1-11, https://www.microcontrollertips. com/dram-vs-sram/ (Year: 2017)—See Office Action dated Aug. 17, 2020 in U.S. Appl. No. 16/279,494 for relevance—no year provided by examiner.

TW Office Action from TW Application No. 10920683760, dated Jul. 20, 2020, 4 pages.

U.S. Office Action in U.S. Appl. No. 16/233,404 dated Jul. 30, 2020, 20 pages.

U.S. Office Action in U.S. Appl. No. 16/279,494 dated Aug. 17, 2020, 25 pages.

Webopedia, "DRAM—dynamic random access memory", Jan. 21, 2017, pp. 1-3, https://web.archive.org/web/20170121124008/https:// www.webopedia.com/TERM/D/DRAM.html (Year: 2017)—See Office Action dated Aug. 17, 2020 in U.S. Appl. No. 16/279,494 for relevance—no year provided by examiner.

Webopedia, "volatile memory", Oct. 9, 2017, pp. 1-4, https://web. archive.org/web/20171009201852/https://www.webopedia.com/ TERMN/volatile_memory.html (Year 2017)—See Office Action dated Aug. 17, 2020 in U.S. Appl. No. 16/279,494 for relevance— no year provided by examiner.

Chen et al., "Eyeriss: An Energy-Efficient reconfigurable accelerator for deep convolutional neural networks," IEEE ISSCC, Jan. 31-Feb. 4, 2016, 3 pages.

EP Extended Search Report from EP19193290.4 dated Feb. 14, 2020, 10 pages.

Gonugondla et al., "Energy-Efficient Deep In-memory Architecture for NAND Flash Memories," IEEE International Symposium on Circuits and Systems (ISCAS), MAy 27-30, 2018, 5 pages.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

TW Office Action from TW Application No. 10820980430, dated Oct. 16, 2019, 6 pages (with English Translation).

U.S. Office Action in U.S. Appl. No. 15/873,369 dated Dec. 4, 2019, 5 pages.

U.S. Office Action in U.S. Appl. No. 15/922,359 dated Oct. 11, 2019, 7 pages.

U.S. Office Action in U.S. Appl. No. 16/233,414 dated Oct. 31, 2019, 22 pages.

U.S. Office Action in related case U.S. Appl. No. 16/037,281 dated Dec. 19, 2019, 9 pages.

U.S. Office Action in related case U.S. Appl. No. 16/297,504 dated Feb. 4, 2020, 15 pages.

Wang et al., "Three-Dimensional NAND Flash for Vector-Matrix Multiplication," IEEE Trans. on Very Large Scale Integration Systems (VLSI), vol. 27, No. 4, Apr. 2019, 4 pages.

U.S. Office Action in U.S. Appl. No. 16/233,414 dated Apr. 20, 2020, 17 pages.

Aritome, et al., "Reliability issues of flash memory cells," Proc. of the IEEE, vol. 81, No. 5, May 1993, pp. 776-788.

Chen et al., "A Highly Pitch Scalable 3D Vertical Gate (VG) NAND Flash Decoded by a Novel Self-Aligned Independently Controlled Double Gate (IDG) StringSelect Transistor (SSL)," 2012 Symp. on VLSI Technology (VLSIT), Jun. 12-14, 2012, pp. 91-92.

Choi et al., "Performance Breakthrough in NOR Flash Memory With Dopant-Segregated Schottky-Barrier (DSSB) SONOS Devices," Jun. 2009 Symposium on VLSITechnology Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Guo et al., "Fast, energy-efficient, robust, and reproducible mixed-signal nauromorphic classifier based on embedded NOR flash memory technology," IEEE Int'l Electron Devices Mtg., San Francisco, CA, Dec. 2-6, 2017, 4 pages.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

(56) References Cited

OTHER PUBLICATIONS

Hubert et al., "A Stacked Sonos Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Merrikh-Bayat et al., "High-Performance Mixed-Signal Neurocomputing with Nanoscale Flowting-Gate Memory Cell Arrays," in IEEE Transactions on Neural Netowrks and Learning Systems, vol. 29, No. 10, Oct. 2018, pp. 4782-4790.

Nowak et al., "Intrinsic fluctuations in Vertical NAND flash memories," 2012 Symposium on VLSI Technology, Digest of Technical Papers, pp. 21-22, Jun. 12-14, 2012.

U.S. Office Action in U.S. Appl. No. 16/279,494 dated Nov. 12, 2020, 25 pages.

U.S. Office Action in U.S. Appl. No. 16/359,919 dated Oct. 16, 2020, 13 pages.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

Webopedia, "SoC", Oct. 5, 2011, pp. 1-2, https://web.archive.org/web/20111005173630/https://www.webopedia.com/ TERM/S/SoC.html (Year: 2011)—See Office Action dated Aug. 17, 2020 in U.S. Appl. No. 16/279,494 for relevance—no month provided by examiner.

Y.X. Liu et al., "Comparative Study of Tri-Gate and Double-Gate-Type Poly-Si Fin-Channel Spli-Gate Flash Memories," 2012 IEEE Silicon Nanoelectronics Workshop (SNW), Honolulu, HI, Jun. 10-11, 2012, pp. 1-2.

U.S. Office Action in U.S. Appl. No. 16/359,919 dated Mar. 3, 2021, 15 pages.

\* cited by examiner

IN-MEMORY COMPUTING DEVICES FOR NEURAL NETWORKS

PRIORITY APPLICATION

This application claims the benefit of U.S. Provisional Patent Application No. 62/698,982 filed 17 Jul. 2018; which application is incorporated herein by reference.

BACKGROUND

Field

The present invention relates to in-memory computing devices, and more particularly, to in-memory computing devices including multiple types of memory cells.

Description of Related Art

A neural network is an information processing paradigm that is inspired by the way biological nervous systems process information. With the availability of large training datasets and sophisticated learning algorithms, neural networks have facilitated major advances in numerous domains such as computer vision, speech recognition, and natural language processing.

The basic unit of computation in a neural network is a neuron. A neuron receives inputs from other neurons, or from an external source and computes an output. FIG. 1 illustrates an example neural network 100. The neural network 100 contains multiple neurons arranged in layers. The neural network 100 includes an input layer 102 of input neurons (i.e., neurons that provide the input data), three hidden layers 106, 108 and 110 of hidden neurons (i.e., neurons that perform computations and transfer information from the input neurons to the output neurons), and an output layer 104 of output neurons (i.e., neurons that provide the output data). Neurons in adjacent layers have synaptic layers of connections between them. For example, the synaptic layer 112 connects neurons in the input layer 102 and the hidden layer 106, the synaptic layer 114 connects neurons in the hidden layers 106 and 108, the synaptic layer 116 connects neurons in the hidden layer 108 and 110, and the synaptic layer 118 connects the neurons in the hidden layer 110 and the output layer 104. All these connections have weights associated with them. For example, the neurons 122, 124 and 126 in the hidden layer 106 are connected to a neuron 128 in the hidden layer 108 by connections with weights $w_1$ 132, $w_2$ 134 and $w_3$ 136, respectively. The output for the neuron 128 in the hidden layer 108 can be calculated as a function of the inputs ($x_1$, $x_2$, and $x_3$) from the neurons 122, 124 and 126 in the hidden layer 106 and the weights $w_1$ 132, $w_2$ 134 and $w_3$ 136 in the connections. The function can be expressed as follows:

$$f(X_i) = \sum_{i=1}^{M} w_i X_i$$

In the sum-of-products expression above, each product term is a product of a variable input $x_i$ and a weight $w_i$. The weight $w_i$ can vary among the terms, corresponding for example to coefficients of the variable inputs $x_i$. Similarly, outputs from the other neurons in the hidden layer can also be calculated. The outputs of the two neurons in the hidden layer 110 act as inputs to the output neuron in the output layer 104.

Neural networks are used to learn patterns that best represent a large set of data. The hidden layers closer to the input layer learn high level generic patterns, and the hidden layers closer to the output layer learn more data-specific patterns. Training is a phase in which a neural network learns from training data. During training, the connections in the synaptic layers are assigned weights based on the results of the training session. Inference is a stage in which a trained neural network is used to infer/predict input data and produce output data based on the prediction. An inference accuracy of a neural network is the rate at which it correctly predicts or infers input data.

In-memory computing is an approach in which memory cells, organized in an in-memory computing device, can be used for both data processing and memory storage. A neural network can be implemented in an in-memory computing device. The weights for the sum-of-products function can be stored in memory cells of the in-memory computing device. The sum-of-products function can be realized as a circuit operation in the in-memory computing device in which the electrical characteristics of the memory cells of the array effectuate the function.

Device variability in the memory cells, inaccurate read and write operations, and other non-ideal device characteristics can lead to fluctuations in the weights stored in the memory cells of the in-memory computing devices. The fluctuations in the stored weights, especially in in-memory computing devices using reprogrammable non-volatile memory cells, such as floating gate memories, phase change memories, resistive RAMs, etc., can lead to less accurate output data by the neural networks implemented in the in-memory computing devices. It is desirable to provide an in-memory computing device with higher inference accuracy.

SUMMARY

An integrated circuit is described herein that comprises an in-memory computing device implementing a neural network. The in-memory computing device has a plurality of synaptic layers, the plurality of synaptic layers including first and second types of synaptic layers. The first type of synaptic layer comprises a first type of memory cells while the second type of synaptic layer comprises a second type of memory cells. Memory cells of the first type are configured for more accurate data storage, and/or more stable read/write operations than memory cells of the second type. Weights stored in memory cells of the first type may have a lower tendency to fluctuate from precise values than memory cells of the second type. Memory cells of the first type may differ from memory cells of the second type in terms of the structures of the memory cells, sizes of the memory cells and/or algorithms used to perform read/write operations in the memory cells.

In some embodiments, the weights stored in the first and second types of memory cells may be the resistance of the memory cells, for example, memory cells such as resistive RAM, magnetic RAM, ferroelectric RAM, and charge trapping memories. In some embodiments, the weights stored may be the information stored in the memory cells, for example, a bit "0" and "1" in static RAM and dynamic RAM. In some embodiments, a digital representation of a weight may be stored in memory cells in a sequence in a row of memory cells where each memory cell in the sequence represents a binary digit in the digital representation of the weight.

The first type of synaptic layer and the second type of synaptic layer may comprise an array of memory cells having an M number of rows and an N number of columns. Each memory cell in the array of memory cells stores a weight factor $W_{mn}$. Columns of memory cells in the array are coupled to a set of first access lines, and rows of memory cells are coupled to a set of second access lines. The array of memory cells may further comprise decoder and driver circuitry electrically coupled to the set of first access lines and the set of second access lines, and sensing circuitry, such as sense amplifiers, electrically coupled to the set of second access lines.

In some embodiments, signals on the first access lines in the set of first access lines represent inputs $x_m$ to the respective rows. Output current sensed at a particular second access line in the set of second access lines by the sensing circuitry can represent a sum-of-products of the inputs $x_m$ by respective weight factors $W_{mn}$ in the column of memory cells coupled to the particular second access line. In some embodiments, outputs sensed in an array of memory cells in a first or second type of synaptic layer are input signals to an array of memory cells in another synaptic layer.

Some embodiments of an in-memory computing device may further comprise a multiplier and accumulator unit. The multiplier and accumulator unit may receive weight factors stored in memory cells in layers of the first and second types of synaptic layers and inputs to estimate a sum-of-products of the inputs and the weight factors.

Some embodiments of an in-memory computing device may further include a plurality of a third type of synaptic layer comprising a third type of memory cells. The third type of memory cell is different than the first type of memory cells and the second type of memory cells.

Methods for manufacturing an in-memory computing device as described herein are also provided.

Other aspects and advantages of the present invention can be seen on review of the drawings, the detailed description, and the claims, which follow.

BRIEF DESCRIPTION OF THE DRAWINGS

A detailed description of embodiments of the present technology is provided with reference to the FIGS. 1-12.

DETAILED DESCRIPTION

A detailed description of embodiments of the present invention is provided with reference to the FIGS. 1-12.

Figure 1:
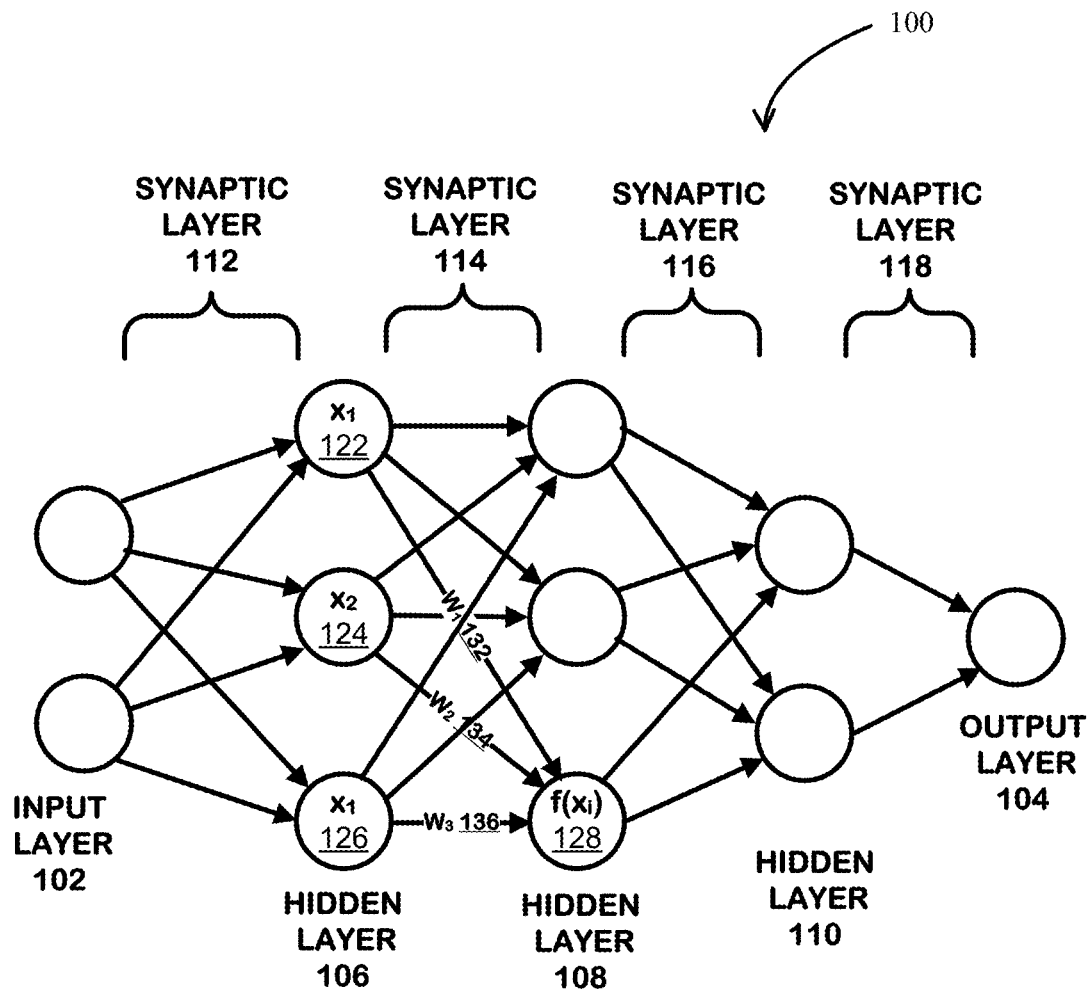
FIG. 1 illustrates an example neural network.

Referring to FIG. 1, the inference accuracy of a neural network 100 can be dependent on weights stored in some synaptic layers than weights stored in other synaptic layers. For example, accuracy of the stored weights may be more important in the synaptic layers closer to the input layer 102 than on the weights in the synaptic layers closer to the output layer 104. In other words, weight fluctuations in the synaptic layers closer to the input layer 102 may contribute more to inference inaccuracy than weight fluctuations in the synaptic layers closer to the output layers 104. Decreasing weight fluctuations or increasing weight precisions in the synaptic layers closer to the input layers may increase the overall inference accuracy of the neural networks.

Figure 2:
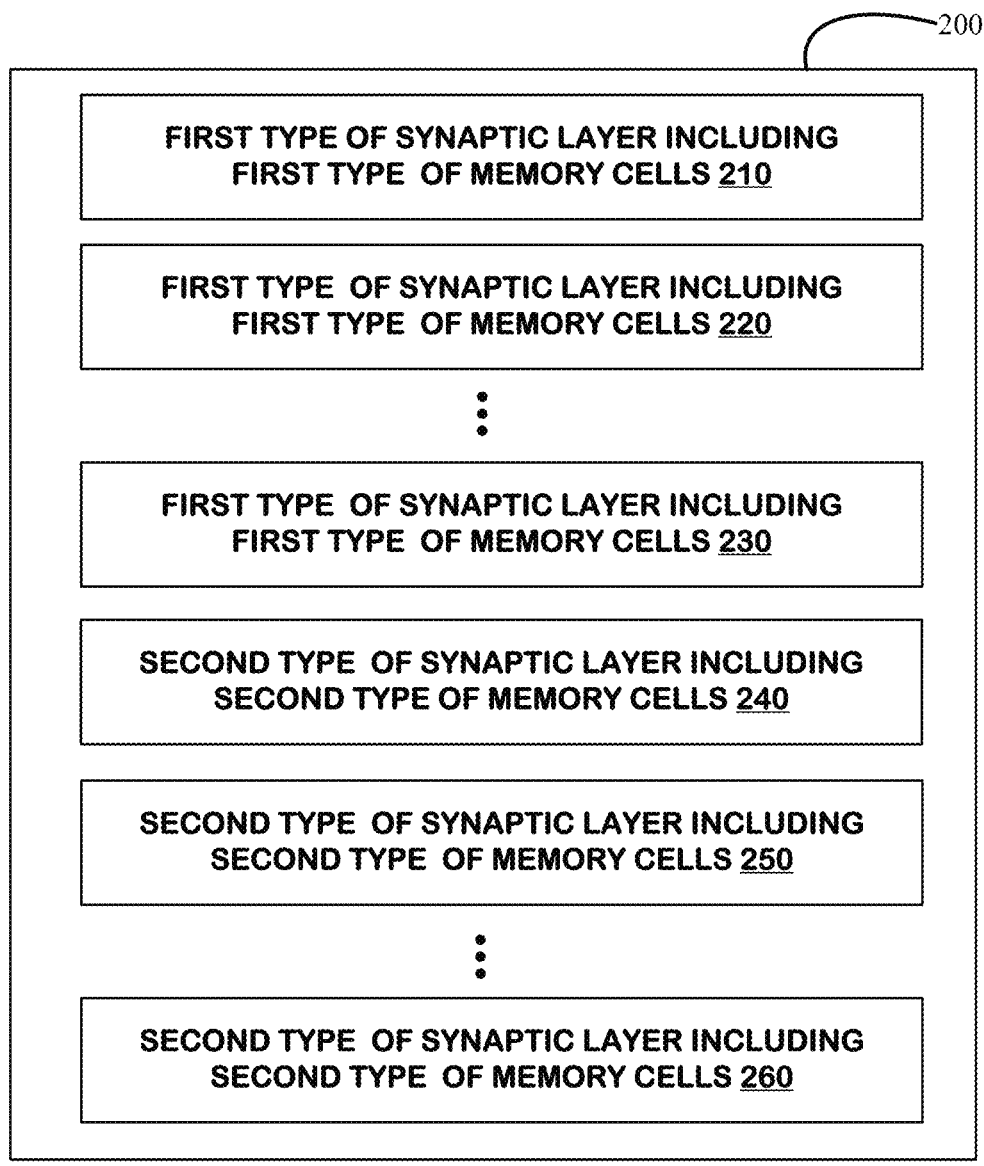
FIG. 2 illustrates an in-memory computing memory device with a first type of synaptic layers and a second type of synaptic layers.

FIG. 2 is a simplified diagram of a memory system 200 of an example in-memory computing device. The memory system 200 includes a plurality of a first type of synaptic layers such as synaptic layers 210, 220 and 230, and a plurality of a second type of synaptic layers such as synaptic layers 240, 250 and 260. For clarity, only three layers of the first type of synaptic layer and three layers of the second type of synaptic layer are shown in FIG. 2. However, any combination of one or more of the first type of synaptic layer and one or more of the second type of synaptic layer can be utilized in the memory system implementing the technology described herein.

The layers of the first type of synaptic layer in the memory system 200 comprise a first type of memory cells that can be used to store weights for synaptic layers in a neural network closer to the input layer. The layers of the second type of synaptic layer in the memory system 200 comprise a second type of memory cells that can be used to store weights for synaptic layers in a neural network closer to the output layer.

The overall inference accuracy of the neural network can be increased by using a memory cells of the first type of memory cell in layers of the first type of synaptic layer that may store more accurate weight, or be less prone to weight fluctuations, when compared to the memory cells of the second type of memory cell. Memory cells of the first type of memory cell are configured for more accurate data storage, and/or more stable read/write operations than memory cells of the second type of memory cell. The first type of memory cell may differ from the second type of memory cell in terms of the types of memory cells included in the cells, structures of the memory cells, or sizes of the memory cells. Memory cells of the first type may also be less prone to device variability and operation failures, such as failed read or write operations.

The memory cells of the first type of memory cell may be volatile memory cells (e.g., SRAM and DRAM) or non-volatile memory cells (e.g., mask ROM, fuse ROM, and resistive RAM). The memory cells of the first type of memory cell may be read-only memory cells (e.g., mask ROM, fuse ROM) or reprogrammable memory cells (e.g., SRAM, DRAM, and resistive RAM). In some embodiments, the weights stored in the memory cells of the first type may be the information stored in the memory cells, for example, SRAM and DRAM storing bits "0" and "1". The accuracy of the weights stored in an SRAM or DRAM cell can be handled by sense amplifiers attached to the cell. In some embodiments, the weights stored in the first type of memory cell may be sensed based on the resistance of the memory cells, for example, memory cells such as resistive RAM, floating gate MOSFETs, dielectric charge trapping devices (e.g., SONOS, BE-SONOS, TANOS, MA BE-SONOS) and phase change memories.

Memory cells of the second type may be more prone to weight fluctuations, device variability and operation failures when compared to memory cells of the first type. Memory cells of the second type may be non-volatile memory cells, such as resistive RAM, floating gate MOSFETs, dielectric charge trapping devices (e.g., SONOS, BE-SONOS, TANOS, MA BE-SONOS), phase change memories, ferroelectric RAMS, and magnetic RAMs. Memory cells of the second type may be reprogrammable memory cells so that weights stored in the second type of memory cell can be changed while training the neural network or fine-tuning the neural network for higher inference accuracy.

In some embodiments, the weights stored in memory cells of the second type may be sensed based on the resistances of the memory cells, for example, memory cells such as resistive RAM, floating gate MOSFETs, dielectric charge trapping devices (e.g., SONOS, BE-SONOS, TANOS, MA BE-SONOS) and phase change memories.

Figure 3A:
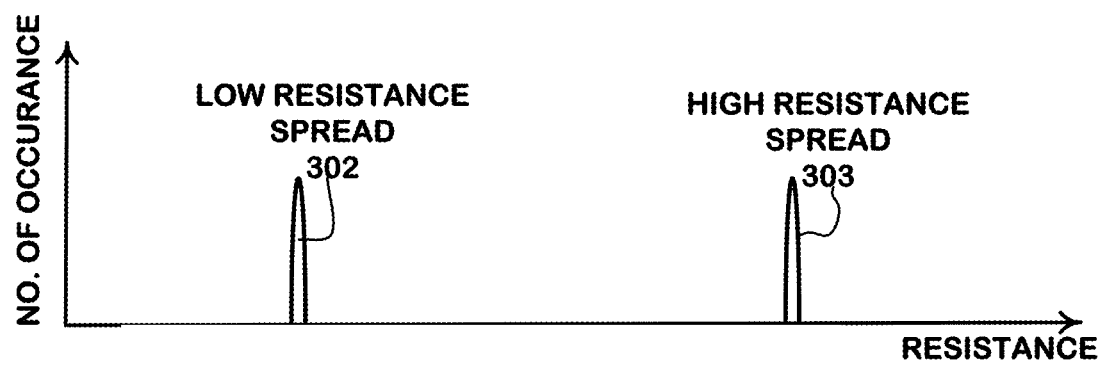
FIGS. 3A and 3B illustrate resistance values of examples first types of memory cells.
Figure 4A:
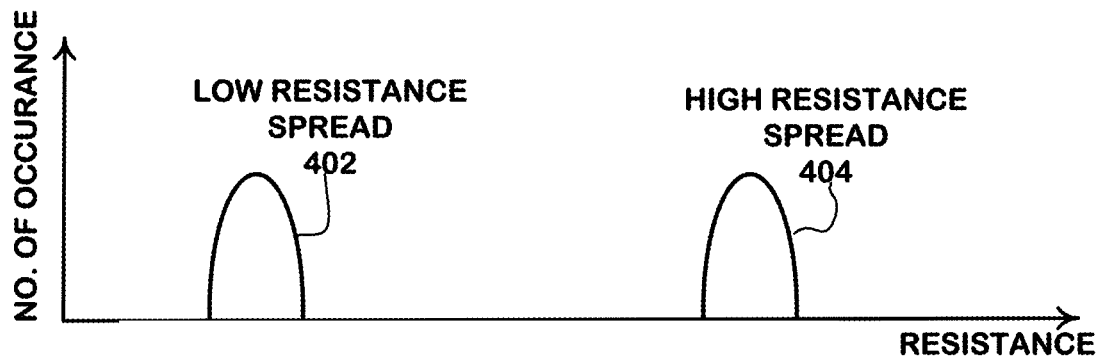
FIGS. 4A, 4B, and 4C illustrate resistance values of examples second types of memory cells.

FIG. 3A and FIG. 4A illustrate distribution of resistance values of a first type of memory cell and a second type of memory cell, respectively. The memory cells in FIG. 3A and FIG. 4A have two resistance states. The first type of memory cell in FIG. 3A has a low resistance spread 302, and a high resistance spread 303. The second type of memory cell in FIG. 4A also has a low resistance spread 402, and a high resistance spread 404. The resistance spreads of the first type of memory cell are narrower than the resistance spreads of the second type of memory cell. The first type of memory cell in FIG. 3A is less prone to resistance drift and noises (e.g., random telegraph noises, thermal noises, etc.) than the second type of memory cell in FIG. 4B. The second type of memory cell is more prone to resistance drift and thermal noises when compared to the first type of memory cells. Reprogramming a second type of memory cell to have a low resistance may result in the second type of memory cell having a resistance anywhere in the low resistance spread. In other words, a less accurate weight can be stored in the second type of memory cell.

In some embodiments of the first type of memory cell, the weights stored may be the two or more bits of information stored in the memory cells, for example, bits "0" and "1" in SRAMs, DRAMs, and ROMs.

Figure 3B:
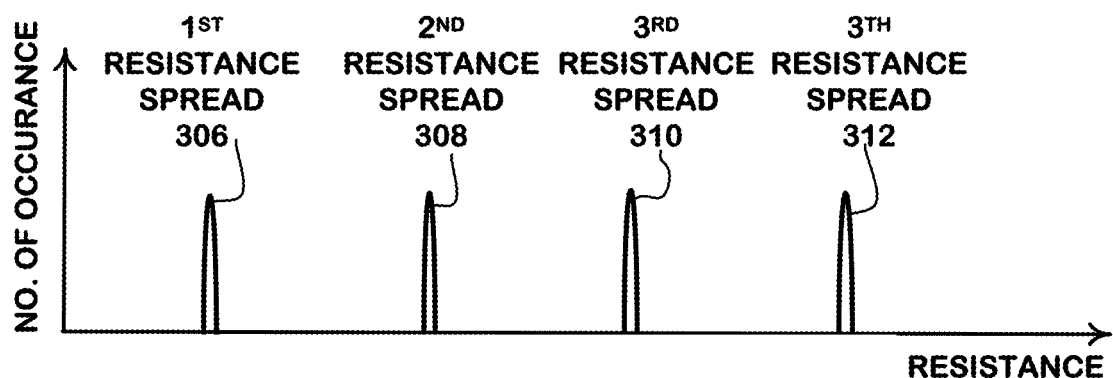
Figure 4B:
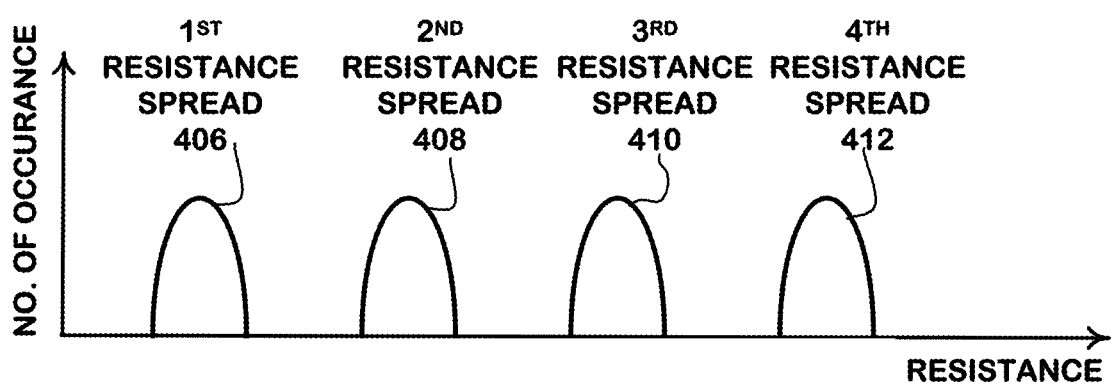
Figure 4C:
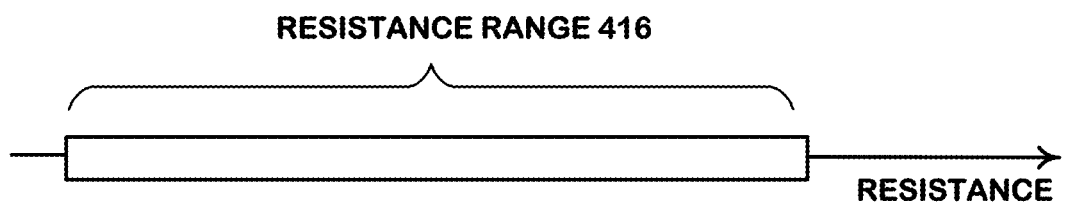

FIG. 3B and FIG. 4B illustrate resistance values of a first type of memory cell and a second type of memory cell, respectively, that store values corresponding to two or more bits of data per cell. Such memory cells have multiple resistance levels, such as a first resistance spread 306, a second resistance spread 308, a third resistance spread 310, and a fourth resistance spread 312 of the first type of memory cell in FIG. 3B, and a first resistance spread 406, a second resistance spread 408, a third resistance spread 410, and a fourth resistance spread 412 of the second type of memory cell in FIG. 4B. Similar to the first type of memory cell, with two resistive states, the first type of memory cell with multiple resistive states is also less prone to resistance drift and noises when compared to the second type of memory cell. The second type of memory cell may have a range of resistance 416 as illustrated in FIG. 4C.

In some embodiments, the memory cells of the first type and the memory cells of the second type may include different memory cells, i.e., the structure of the memory cells of the first type being different than the structure of the memory cells of the second type. The memory cells of the first type may include volatile memory cells (e.g., SRAM and DRAM), and the memory cells of the second type may include non-volatile memory cells (e.g., resistive RAM). In some embodiments, memory cells of the first type may include read-only memory cells (e.g., fuse ROM), and memory cells of the second type may include reprogrammable memory cells (e.g., resistive RAM, phase chase memories, charge trapping memories).

In some embodiments of the in-memory computing, memory cells of the first type and memory cells of the second type may include the same type of memories (e.g., resistive RAMs), and the size of the first type of memory cell may be bigger than the second type of memory cell. The larger memory cells of the first type will be less noisy than the memory cells of the second type, resulting in less weight fluctuation in the memory cells of the first type. In some embodiments, the fabrication process of the first type of memory cell may be different than the fabrication process of the second type of memory cell, resulting in the memory cells of the first type having less device variability than the memory cells of the second type. In some embodiments, the memory material for data storage in memory cells of the first type may be different than the memory material used in memory cells of the second type. For example, memory cells of the first type may be resistive RAMs with HfOx as the memory material and memory cells of the second type may be resistive RAMs with CoOx as the memory material.

In some embodiments, data may be read or written in the first type of memory cell with a different algorithm than the one used to read or write data in the second type of memory cell. For example, when multiple bits storing charge trapping memories are used as the first and second types of memory cell, incremental-step-pulse programming (ISPP) can be used to tighten threshold voltage distribution and resistance spreads for memory cells of the first type, and single pulse programming can be used for memory cells of the second type.

In some embodiments, the memory system 200 may include a plurality of layers of a third type of synaptic layer. Layers of the third type of synaptic layer may comprise memory cells of a third type that can be used to store weights for middle synaptic layers in a neural network. Weights stored in memory cells of the third type may be less accurate than the weights stored in memory cells of the first type, and more accurate than the weights stored in memory cells of the second type. In some embodiments, the memory system 200 may include any number of types of memory cells, each type of memory cell having a different degree of weight fluctuations.

Figure 5:
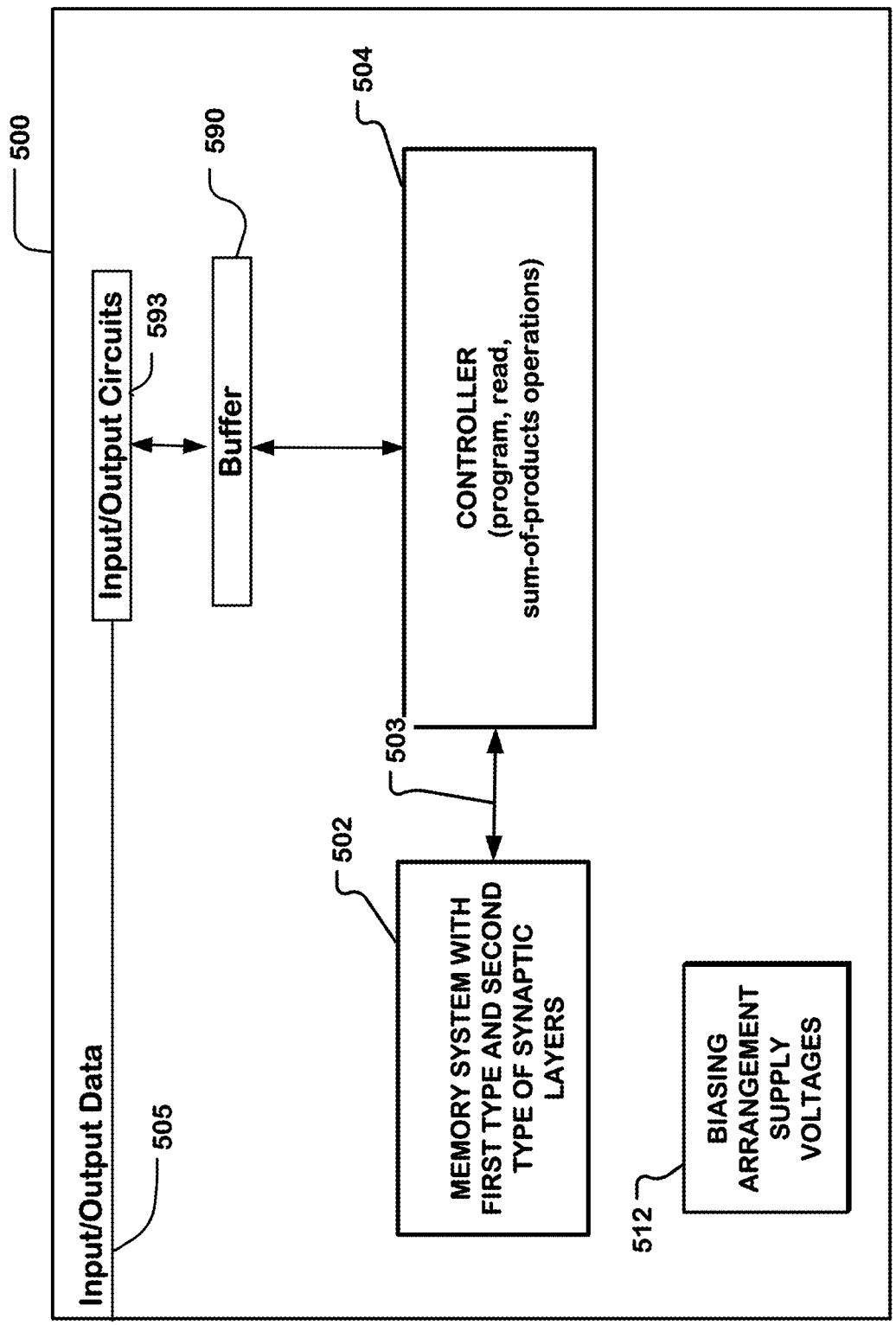
FIG. 5 illustrates a simplified chip block diagram of a first example of an in-memory computing memory device with first and second types of synaptic layers.

FIG. 5 illustrates a simplified chip block diagram of a first example of an in-memory computing device 500 implementing a neural network. The in-memory computing device 500 includes a memory system 502. The memory system 502 comprises a plurality of layers of a first type of synaptic layer, and a plurality of layers of a second type of synaptic layer. The memory cells of the first type in the synaptic layers of the first type in the memory system 502 store weights for the synaptic layers of the neural network near the input layer. Memory cells of the second type in the synaptic layers of the second type store weights for the synaptic layers near the output layer of the neural network. Circuit operations in the first and second types of memory cells in the first and second types of synaptic layers perform the inferencing of input data in the neural network and produce output data.

Input/output circuits 593 receive input data from sources external to the in-memory computing device 500. The input/output circuits 593 also drive output data to destinations external to the in-memory computing device 500. Input/output data and control signals are moved via data bus 505 between the input/output circuits 593, the controller 504 and input/output ports on the in-memory computing device 500 or other data sources internal or external to the in-memory computing device 500, such as a general purpose processor or special purpose application circuitry, or a combination of modules providing system-on-a-chip functionality supported by the memory system 502. Buffer circuits 590 can be coupled to the input/output circuits 593 and the controller 504 to store input/output data and control signals.

The controller 504 can include circuits for selectively applying program voltages to the memory cells of the first type in the synaptic layers of the first type, and the memory cells of the second type in the synaptic layers of the second type in the memory system 502 in response to the input data and control signals in the buffer circuits 590. In the example shown in FIG. 5, the controller 504, using a bias arrangement state machine 512, controls the application of supply voltages generated or provided through the voltage supply or supplies in the memory system 502, for sum-of-products operations, write operations with a first write algorithm for the memory cells of the first type, and a second write algorithm for the memory cells of the second type, and read operations with a first read algorithm for the memory cells of the first type, and a second read algorithm for the memory cells of the second type. The controller 504 is coupled to the buffer circuits 590 and the memory system 502. The controller 504 can be implemented using special-purpose logic circuitry as known in the art. In alternative embodiments, the controller 504 comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller 504. A bias arrangement state machine 512 controls the biasing arrangement supply voltages as described herein.

Figure 6:
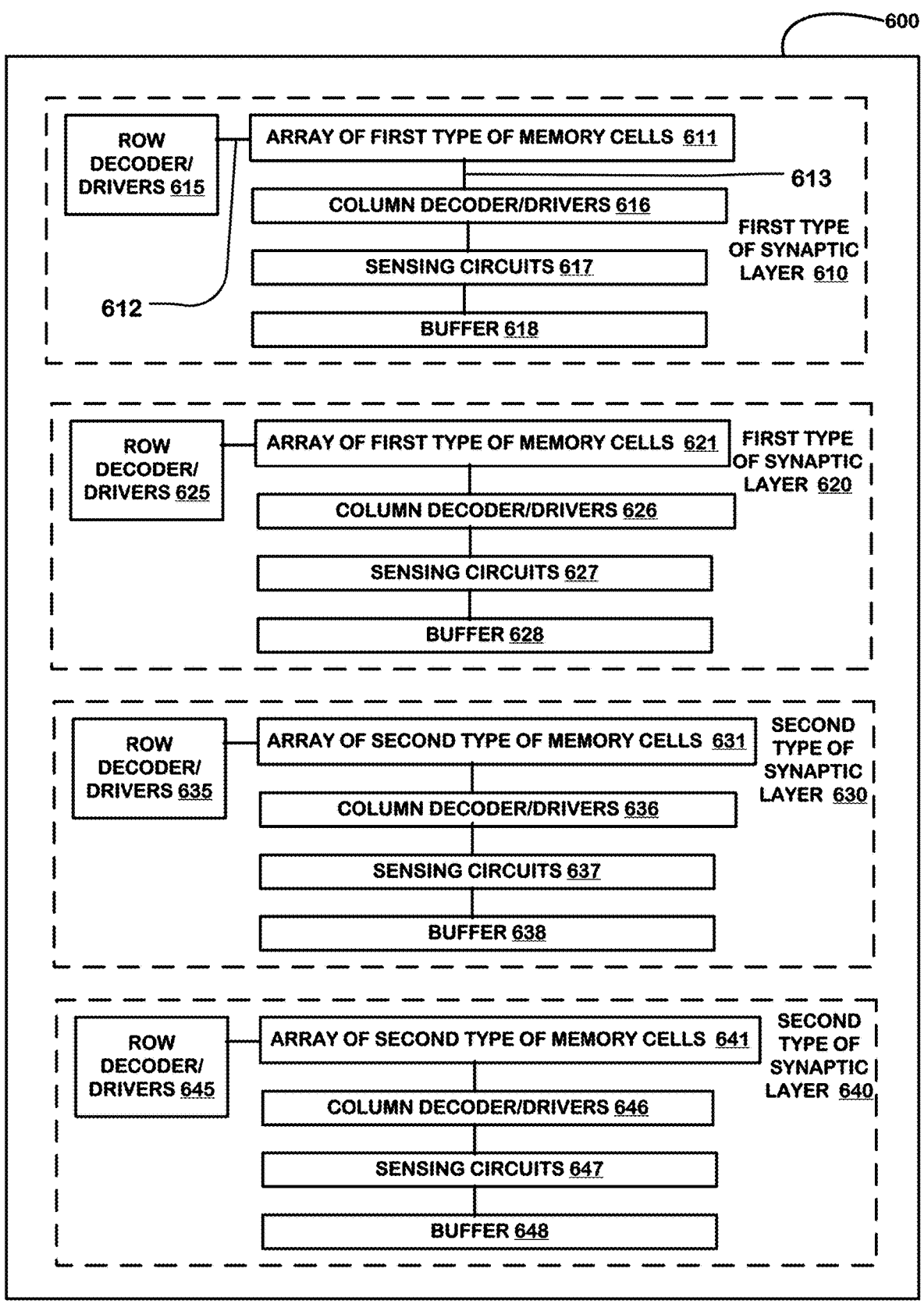
FIG. 6 illustrates an example memory system with two first type of synaptic layers and two second type of synaptic layers.

FIG. 6 illustrates a memory system 600 with two synaptic layers of the first type, 610 and 620, and two synaptic layers of the second type, 630 and 640. Synaptic layers of the first type 610 comprise an array of memory cells of a first type 611. For clarity, only one array of memory cells of the first type is shown in the synaptic layer of the first type of synaptic layer 610 in FIG. 6. However, a synaptic layer of the first type may have multiple arrays of the memory cells of the first type. The synaptic layer of the first type of synaptic layer 610 also includes a set of first access lines 612 coupled to the memory cells of the first type in respective rows of the memory cells of the first type, and a row decoder/drivers 615. The row decoder/drivers 615 may receive inputs from the controller 504 in FIG. 5 or other synaptic layers and assert signals on the first access lines in the set of first access lines representing inputs to the respective rows of the memory cells of the first type.

The synaptic layer of the first type of synaptic layer 610 also includes a set of second access lines 613 coupled to the memory cells of the first type in respective columns of the memory cells of the first type, and a column decoder/drivers 616. A set of sensing circuits 617, such as sense amplifiers, is coupled to respective second access lines in the set of second access lines via the column decoder/drivers 616. In some embodiments, the set of sensing circuits 617 may be coupled to second access lines in the set of second access line directly. For sum-of-products operations using the array of the memory cells of the first type, the set of sensing circuits 617 can sense current at second access lines 613 from the array of the memory cells of the first type of memory cell 611. Currents sensed at a particular second access line in the set of second access lines can represent a sum-of-products of the inputs asserted in the first access lines and the weight factor stored in the array of the memory cells of the first type of memory cell 611. Sensed data from the second access lines are supplied to the data buffer 618. The data buffer 618 can store the sum-of-products from the array of the memory cells of the first type of memory cell 611.

Memory cell addresses and input data from external sources are supplied from the controller 504 to the row decoder/drivers 615 of the array of the memory cells of the first type of memory cell 611 through the bus 503. Input data from other synaptic layers can also be supplied to the row decoder/drivers 615 of the array of the memory cells of the first type of memory cell 611. For memory read operations, sensed data from the sensing circuits 617 are supplied to the data buffer 618, which is in turn coupled to the controller 504 via the bus 503.

Similar to the first type of synaptic layer 610, the first type of synaptic layer 620 includes an array of memory cells of the first type of memory cell 621, a row decoder/drivers 625, a column decoder/drivers 626, a set of sensing circuits 627 and a data buffer 628.

The memory system 600 also includes the synaptic layers of the second type of synaptic layer 630 and 640. The second type of synaptic layer 630 includes an array of memory cells of the second type of memory cell 631, a row decoder/drivers 635, a column decoder/drivers 636, a set of sensing circuits 637 and a data buffer 638. The second type of synaptic layer 640 includes an array of memory cells of the second type of memory cell 641, a row decoder/drivers 645, a column decoder/drivers 646, a set of sensing circuits 647 and a data buffer 648.

For the first and second types of memory cells that include phase change memories, resistive RAMs, ferroelectric RAMs, and magnetic RAMs, the first access lines can be bit lines and the second access lines can be word lines or vice versa. For charge trapping memories, the first access lines can be word lines and the second access lines can be bit lines. Charge trapping memories may also have third access lines such as source lines.

Figure 7:
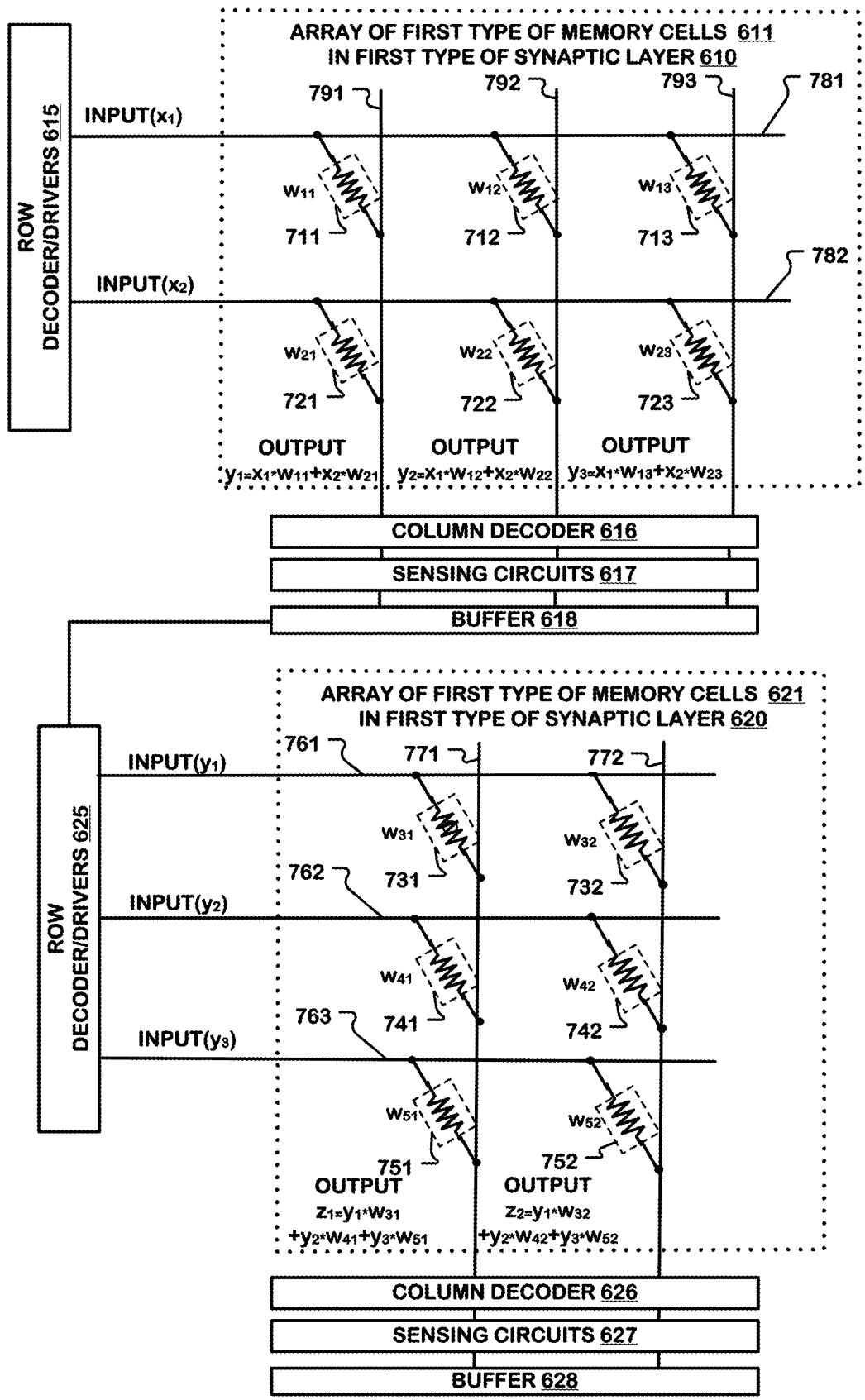
FIG. 7 illustrates example arrays of the first type of memory cells in the first type of synaptic layers in FIG. 6.

FIG. 7 illustrates example arrays of memory cells of the first type of memory cell 611 and 621 in the two synaptic layers of the first type of synaptic layer 610 and 620 in FIG. 6. Memory cells of the first type in the arrays of the memory cells of the first type of memory cell 611 and 621 can be resistive RAMs, where resistances of the memory cells represent the weights stored in the memory cells. The array of memory cells of the first type includes an M number of rows and an N number of columns of memory cells. Each memory cell in the array represents a weight factor $W_{mn}$ of the cell. The array of memory cells of the first type of memory cell 611 includes two rows and three columns. The memory cells of the first type of memory cell 711, 712, 713, 721, 722, and 723 store weights $w_{11}$, $w_{12}$, $w_{13}$, $w_{21}$, $w_{22}$, and $w_{23}$ respectively.

A set of second access lines (e.g., 791, 792, and 793) is coupled to the memory cells of the first type in respective columns of the memory cells of the first type. A set of first access lines (e.g., 781, 782) is coupled to the memory cells of the first type in respective rows of memory cells of the first type. The set of first access lines (e.g., 781, 782) is coupled to the row decoder/drivers 615 and the set of second access lines are coupled to the column decoder 616. Signals on the first access lines in the set of first access lines can represent inputs $x_1$, $x_2$ to the respective rows. As shown in FIG. 6, the row decoder/drivers 615 asserts a signal input $x_1$ on the first access line 781 and a signal input $x_2$ on the first access line 782.

The sensing circuit 617 is coupled to respective second access lines in the set of second access lines via the column decoder 616. Current (e.g., y1, y2, y3) sensed at a particular second access line (e.g., 791, 792, 793) in the set of second access lines can represent a sum-of-products of the inputs x1, x2 by respective weight factors $W_{mn}$ The sum-of-products y1, y2, y3 can be stored in the data buffer 618. The stored sum-of-products can be sent to the array of memory cells of the first type of memory cell 621 in the synaptic layer of the first type of synaptic layer 620 of the memory system 600.

The array of memory cells of the first type of memory cell 621 includes three rows and two columns. Each memory cell in the array represents a weight factor $W_{mn}$ of the cell. The memory cells 731, 732, 741, 742, 751, and 752 of the first type of memory cells store weights w31, w32, w41, w42, w51, and w52 respectively.

A set of second access lines (e.g., 771, 772) is coupled to the memory cells in respective columns of memory cells. A set of first access lines (e.g., 761, 762, and 763) is coupled to the memory cells in respective rows of memory cells. The set of first access lines (e.g., 761, 762, 763) is coupled to the row decoder/drivers 625 and the set of second access lines is coupled to the column decoder 626. The row decoder/drivers 625 receives input signals $y_1$, $y_2$, $y_3$ from the array of memory cells of the first type of memory cell 611 in the synaptic layer of the first type of synaptic layer 610 and asserts the signals on the first access lines in the set of first access lines. As shown in FIG. 6, the row decoder/drivers 625 asserts the signal input $y_1$ on the first access line 761, the signal input $y_2$ on the first access line 762 and the signal input $y_3$ on the first access line 763.

The sensing circuit 627 is coupled to respective second access lines in the set of second access lines via the column decoder 626. Current (e.g., $z_1$, $z_2$) sensed at a particular second access line (e.g., 771, 772) in the set of second access lines can represent a sum-of-products of the inputs by respective weight factors. The sum-of-products $z_1$, $z_2$ can be stored in the data buffer 628. The stored sum-of-products can be sent to the array of the second type of memory cell 631 in the second type of synaptic layer 630 of the memory system 600 or to the controller 504 in FIG. 5.

Figure 8:
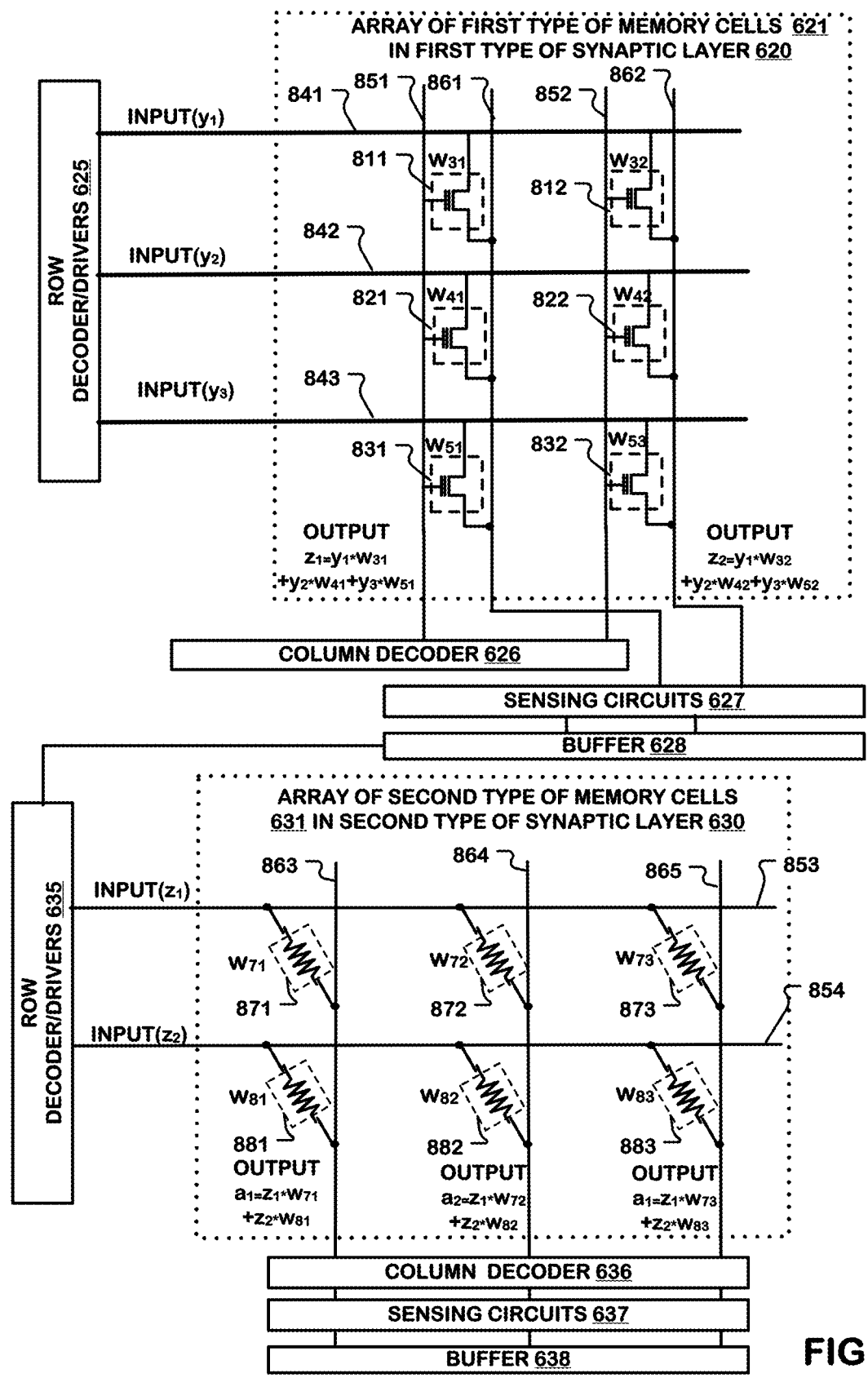
FIG. 8 illustrates an example array of the first type of memory cells in the first type of synaptic layer and an example array of the second type of memory cells in the second type of synaptic layer in FIG. 6.

FIG. 8 illustrates an embodiment where charge trapping memories are used as the first type of memory cell in the first type of synaptic layer 620, and resistive RAMS are used as the second type of memory cell in the third synaptic layer 630.

The array of memory cells of the first type of memory cell 621 includes three rows and two columns of memory cells of the first type, where a set of third access lines, such as the source lines of charge trapping memories, is coupled to the memory cells of the first type in respective columns of memory cells of the first type. Memory cells of the first type in the array can each comprise a transistor having a voltage threshold, representing a weight factor $W_{mn}$ of the cell. The memory cells 811, 812, 821, 822, 831, and 832 store weights $w_{31}$, $w_{32}$, $w_{41}$, $w_{42}$, $w_{51}$, and $w_{52}$, respectively.

A set of second access lines (e.g., 851, 852) is coupled to the memory cells of the first type in respective columns of memory cells of the first type. A set of first access lines (e.g., 841, 842, and 843) is coupled to the memory cells of the first type in respective rows of memory cells of the first type. The set of first access lines (e.g., 841, 842, and 843) are coupled to the row decoder/drivers 625. Signals on the first access lines in the set of first access lines can represent inputs $y_1$, $y_2$, and $y_3$ to the respective rows. As shown in FIG. 8, the row decoder/drivers 625 asserts a signal input $y_1$ on the first access line 841, a signal input $y_2$ on the first access line 842 and a signal input $y_3$ on the first access line 843. A set of second access lines (e.g., 851, 852) is coupled to gates of the transistors in the memory cells of the first type in respective columns of memory cells of the first type. Signals on the second access lines in the set of second lines can select respective columns of the memory cells of the first type.

The set of third access lines (e.g., 861, 862) is coupled to the column decoder 626. The sensing circuit 627 is coupled to respective third access lines in the set of third access lines. Current (e.g., $z_1$, $z_2$) sensed at a particular second access line (e.g., 861, 862) in the set of third access lines can represent a sum-of-products of the inputs $y_1$, $y_2$, $y_3$ by respective weight factors $W_{mn}$. The sum of products $z_1$, $z_2$ can be stored in the data buffer 628. The stored sum-of-products $z_1$, $z_2$ can be sent to the array of memory cells of the second type of memory cells 631 in the synaptic layers of the second type of synaptic layer 630 of the memory system 600.

The array of memory cells of the second type of memory cell 631 includes two rows and three columns of resistive RAMs. Each memory cell of the second type in the array represents a weight factor W of the cell. The memory cells 871, 872, 873, 881, 882, and 883 store weights $w_{71}$, $w_{72}$, $w_{73}$, $w_{81}$, $w_{82}$, and $w_{83}$, respectively.

A set of second access lines (e.g., 863, 864, and 865) is coupled to the memory cells in respective columns of memory cells. A set of first access lines (e.g., 853, 854) is coupled to the memory cells in respective rows of memory cells. The set of first access lines (e.g., 853, 854) are coupled to the row decoder/drivers 635 and the set of second access lines (e.g., 863, 864, and 865) are coupled to the column decoder 636. The row decoder/drivers 635 receives input signals $z_1$, $z_2$ from the array of memory cells of the first type of memory cells 621 in the synaptic layer of the first type of synaptic layer 610 and asserts the signals on the first access lines in the set of first access lines. A signal input $z_1$ is asserted on the first access line 853, and a signal input $z_2$ is asserted on the first access line 854.

Current (e.g., $a_1$, $a_2$, $a_3$) sensed at a particular second access line (e.g., 863, 864, 865) in the set of second access lines can represent a sum-of-products of the inputs by respective weight factors. The sum-of-products $a_1$, $a_2$, $a_3$ can be stored in the data buffer 628.

Figure 9:
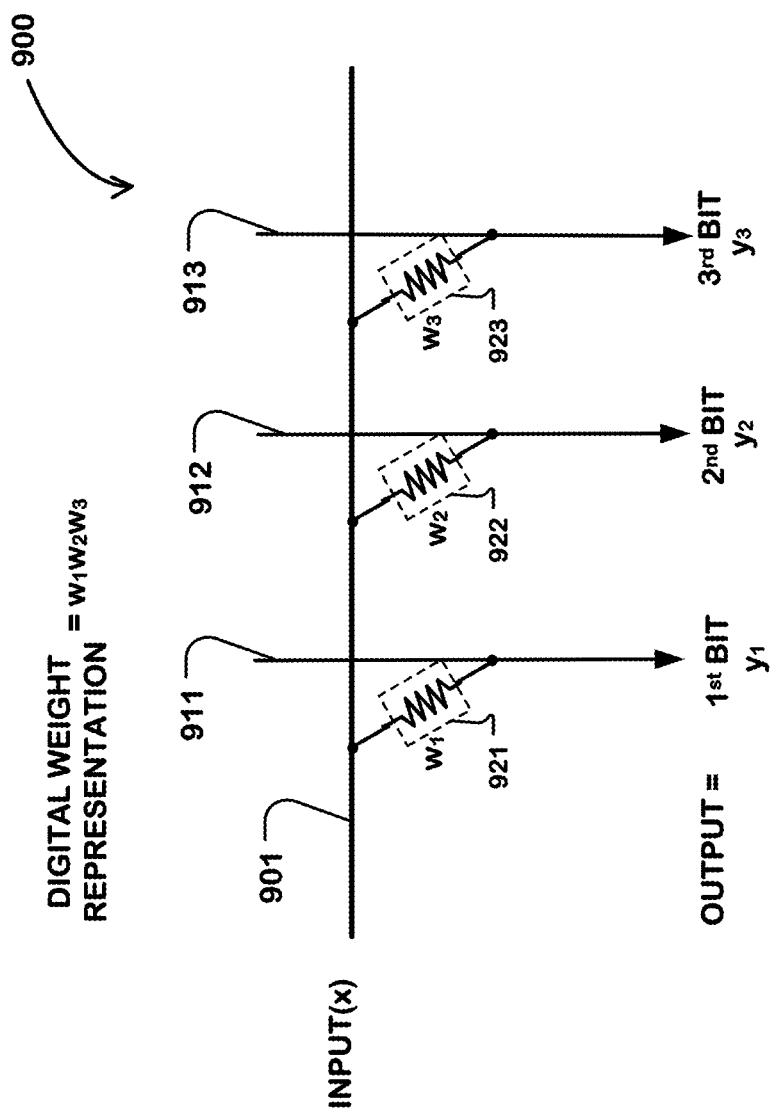
FIG. 9 illustrates a row of memory cells storing a digital weight representation.

Digital representations of weights can also be stored in arrays of memory cells of the first type. FIG. 9 illustrates a portion of a row of memory cells of the first type of memory cells 900 which stores a digital representation of the weight $w_1w_2w_3$. Memory cells of the first type are coupled to a first access line 901 and second access lines 911, 912 and 913.

The three memory cells of the first type of memory cells 921, 922 and 923 have two resistance states, a low resistance state representing bit "0" and a high resistance state representing bit "1". The weights $w_1$ stored in the first type of memory cell 921, the weight $w_2$ stored in the first type of memory cell 922 and the weight $w_3$ stored in the first type of memory cell 923, represent the first digit, the second digit and the third digit of the digital weight presentation, respectively. An input signal x is asserted on the first access line 901. Current (e.g., $y_1$, $y_2$, $y_3$) sensed at a particular second access line (e.g., 911, 912, 913) in the set of second access lines can represent a sum-of-products of the inputs x and the digital weight $w_1 w_2 w_3$.

Figure 10:
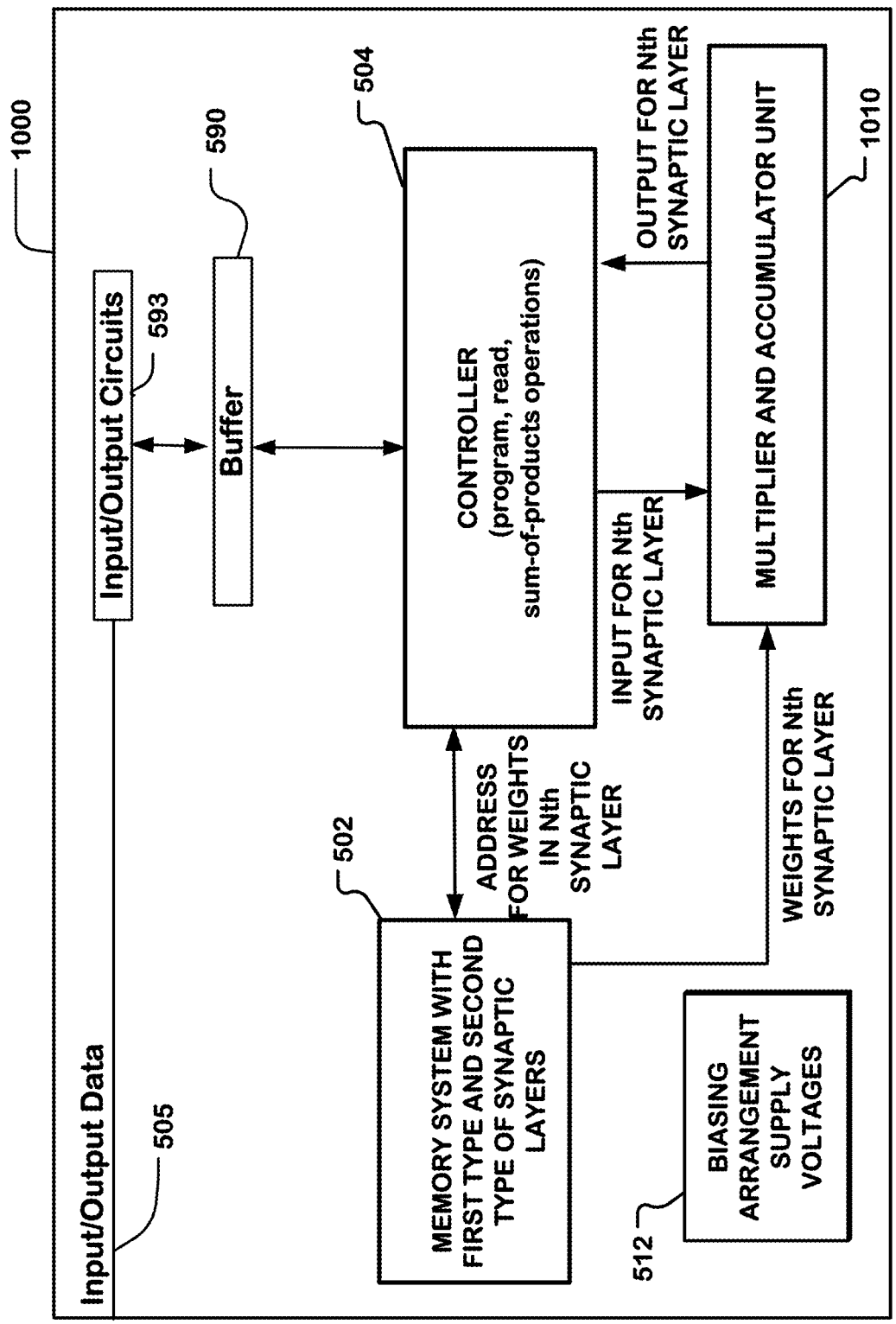
FIG. 10 illustrates a simplified chip block diagram of a second example of an integrated circuit device including an in-memory computing memory array with first and second types of synaptic layers and a multiplier and accumulator unit.

FIG. 10 illustrates a simplified chip block diagram of a second example of an in-memory computing device 1000 implementing a neural network. Similar to the in-memory computing device 500 in FIG. 5, the in-memory computing device 1000 comprises a memory system 502 including a plurality of synaptic layers of the first type, and a plurality of synaptic layers of the second type, input/output circuits 593, buffer circuits 590, a controller 504 and a bias arrangement state machine 512. In addition, the in-memory computing device 1000 comprises a multiplier and accumulator unit 1010.

Memory cells of the first type in synaptic layers of the first type in the memory system 502 store weights for the synaptic layers of a neural network near the input layer. Memory cells of the second type in the synaptic layers of the second type store weights for the synaptic layers near the output layer of the neural network. The multiplier and accumulator unit 1010 performs the sum-of-products calculation with the input data received from sources external to the in-memory computing device and weights stored in the memory cells of the first type, and the memory cells of the second type in the memory system 502. The multiplier and accumulator unit 1010 may be a general purpose processor or special purpose application circuitry, or a combination of modules providing system-on-a-chip functionality.

The controller 504 can further include circuitry for supplying addresses for memory cells storing weights for the Nth synaptic layers to row and column decoders in the memory system 502 and inputs for the Nth synaptic layer to the multiplier and accumulator unit 1010. The multiplier and accumulator unit 1010 receives weights stored for the Nth synaptic layer from the memory system 502 to compute sum-of-products. The multiplier and accumulator unit provides the sum-of-products to the controller 504 as the output for the Nth synaptic layer. The output for the Nth synaptic layer can be used as the inputs for the N+1th synaptic layer, or the output can be the final output of the neural network.

Figure 11:
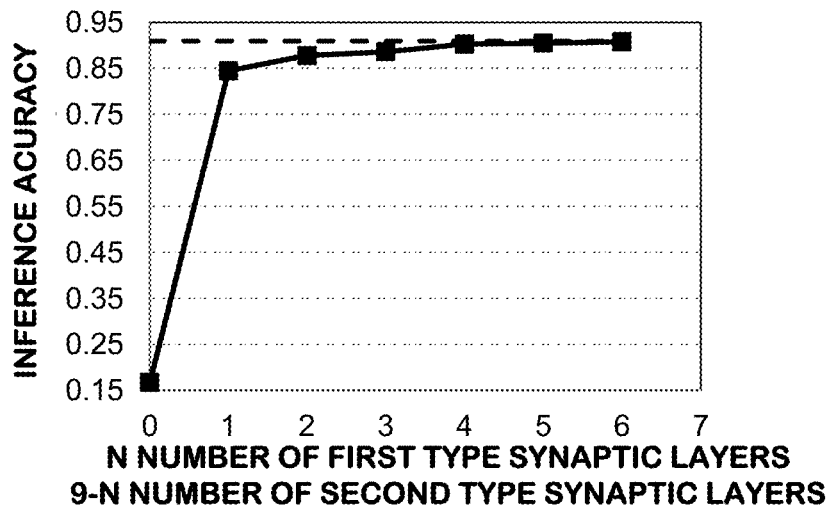
FIG. 11 illustrates inference accuracies of an in-memory computing memory device with first and second types of synaptic layers.

FIG. 11 illustrates inference accuracies of in-memory computing devices with nine synaptic layers in total. The first N number of synaptic layers are the first type of synaptic layers with SRAM devices as the first type of memory cells, and the rest of the N−9 of synaptic layers are the second type of synaptic layers with resistive RAM devices as the second type of memory cells. When all the synaptic layers are the first type of synaptic layers, the inference accuracy is 90.94%. The inference accuracy is determined by the average accuracy after classifying 10,000 test image data. When all the synaptic layers are the second type of synaptic layer, the inference accuracy is 16.73%. When there is one synaptic layer of the first type, and eight synaptic layers of the second type, the inference accuracy is 84.45%. For an additional synaptic layer of the first type, the inference accuracy increases to 87.78%. Increasing the number of synaptic layers of the first type to four improves the inference accuracy to that when all the synaptic layers are of the first type.

Figure 12:
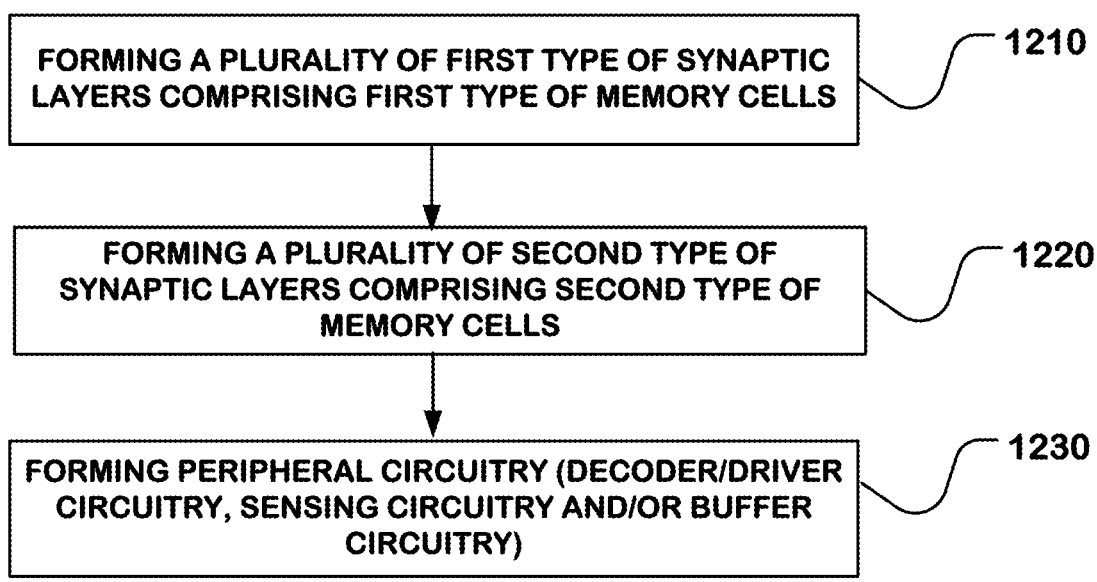
FIG. 12 is a simplified flowchart for manufacturing an in-memory computing memory device in an integrated circuit in accordance with the present technology.

FIG. 12 is a simplified flowchart for manufacturing an in-memory computing device in an integrated circuit device in accordance with the present technology. At Step 1210, a plurality of synaptic layers of the first type comprising memory cells of the first type, are formed (e.g., the layers of the first type of synaptic layer 610, 620 in FIG. 6). At Step 1220, a plurality of synaptic layers of the second type, comprising memory cells of the second type, are formed (e.g., the layers of the second type of synaptic layer 630, 640 in FIG. 6).

The first type of memory cell is less prone to weight fluctuations than the second type of memory cell. In some embodiments, the fabrication process of the first type of memory cell may be different than the fabrication process of the second type of memory cell, the first type of memory cell having less device variability when compared to the second type of memory cell.

In some embodiments of the in-memory computing device, the first type of memory cell and the second type of memory cell may include the same type of memory cell (e.g., resistive RAMs), and the size of the memory cells of the first type may be bigger than the memory cells of the second type. The larger memory cells of the first type will be less noisy than the memory cells of the second type, resulting in less weight fluctuations in the memory cells of the first type.

In some embodiments, memory cells of the first type, and memory cells of the second type, may include different memory cells, i.e., the structure of memory cells of the first type being different than memory cells of the second type. Memory cells of the first type may include volatile memory cells (e.g., SRAM and DRAM), and memory cells of the second type may include non-volatile memory cells (e.g., resistive RAM). In some embodiments, memory cells of the first type may include read-only memory cells (e.g., fuse ROM), and memory cells of the second type may include reprogrammable memory cells (e.g., resistive RAM).

Memory cells of the first type may be volatile memory cells (e.g., SRAM and DRAM) or non-volatile memory cells (e.g., mask ROM, fuse ROM, and resistive RAM). Memory cells of the first type may be read-only memory cells (e.g., mask ROM, fuse ROM) or reprogrammable memory cells (e.g., SRAM, DRAM, and resistive RAM). In some embodiments, the weights stored in memory cells of the first type may be the resistance of the memory cells, for example, memory cells such as resistive RAM, floating gate MOSFETs, dielectric charge trapping devices (e.g., SONOS, BE-SONOS, TANOS, MA BE-SONOS) and phase change memories. In some embodiments, the weights stored may be the two or more bits information stored in the memory cells, for example, bits "0" and "1" in SRAMs, DRAMs, and ROMs.

Memory cells of the second type may be non-volatile memory cells, such as resistive RAM, floating gate MOSFETs, dielectric charge trapping devices (e.g., SONOS, BE-SONOS, TANOS, MA BE-SONOS), phase change memories, ferroelectric RAMS, and magnetic RAMs. In some embodiments, the weights stored in memory cells of the second type may be the resistance of the memory cells, for example, memory cells such as resistive RAM, floating gate MOSFETs, dielectric charge trapping devices (e.g., SONOS, BE-SONOS, TANOS, MA BE-SONOS) and phase change memories.

At step 1330, peripheral circuitries supporting the in-memory computing device are formed. The peripheral circuitry may be row decoder/drivers (e.g., row decoders/drivers 615, 625, 635, 645 in FIG. 6), column decoders/drivers (e.g., column decoders/drivers 616, 626, 636, 646 in FIG. 6), sensing circuits (e.g., sensing circuits 617, 627, 637, 647 in FIG. 6), and buffer circuitry (e.g., data buffers 618, 628, 638, 648 in FIG. 6). The peripheral circuitry may also include a controller (e.g., the controller 504 in FIG. 5), and a multiplier and accumulator unit (e.g., the unit 1010 in FIG. 10). The controller may include circuitries for performing write operations with a first write algorithm in the first type of memory cell and with a second write algorithm in the second type of memory cell. The controller may include circuitries for performing read operations with a first read algorithm in the first type of memory cell and with a second read algorithm in the second type of memory cell.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device comprising:
    a plurality of synaptic layers, at least one of the synaptic layers is a first type of synaptic layer comprising a first type of memory cells arranged for in-memory computation and at least one of the synaptic layers is a second type of synaptic layer comprising a second type of memory cells, the first type of memory cells are different than the second type of memory cells,
    wherein the first type of synaptic layer comprises a first array of memory cells configured to generate a first sum of products, based on one or more first weight factors stored in the first array of memory cells, and
    wherein the second type of synaptic layer comprises a second array of memory cells configured to generate a second sum of products, based on one or more second weight factors stored in the second array of memory cells.

2. The device of claim 1, wherein the first type of memory cells have a first structure and the second type of memory cells have a second structure, the first structure being different than the second structure.

3. The device of claim 1, wherein the first type of memory cells comprise a first memory material and the second type of memory cells comprise a second memory material, the first memory material being different than the second memory material.

4. The device of claim 1, comprising peripheral circuitry performing write operations in the first type of memory cells with a first write algorithm and in the second type of memory cells using a second write algorithm, the first write algorithm being different than the second write algorithm.

5. The device of claim 4, the peripheral circuitry further performing read operations in the first type of memory cells with a first read algorithm and in the second type of memory cells using a second read algorithm, the first read algorithm being different than the second read algorithm.

6. The device of claim 1, wherein the first type of memory cells are read-only memory cells while the second type of memory cells are reprogrammable cells.

7. The device of claim 1, wherein the first type of memory cells are volatile memory cells while the second type of memory cells are non-volatile memory cells.

8. The device of claim 1, wherein at least one of the first and second types of synaptic layers comprises:
    an array of memory cells having an M number of rows and an N number of columns of memory cells, each memory cell in the array of memory cells storing a weight factor $W_{mn}$;
    a set of first access lines coupled to memory cells in respective rows of memory cells; and
    a set of second access lines coupled to memory cells in respective columns of memory cells.

9. The device of claim 8, wherein signals representing inputs $x_m$ are asserted on first access lines in the set of first access lines; and current sensed at a particular second access line in the set of second access lines represents a sum of products of the inputs $x_m$ by respective weight factors $W_{mn}$, stored in a particular column of memory cells coupled to the particular second access line.

10. The device of claim 9, further comprising:
    decoder and driver circuitry electrically coupled to the set of first access lines and the set of second access lines, the decoder and driver circuitry configured to asserting signals representing inputs $x_m$, on first access lines in the set of first access lines; and
    sensing circuitry electrically coupled to the set of second access lines, the sensing circuitry configured to sensing current at second access lines in the set of second access lines.

11. The device of claim 8 further comprising a multiplier and accumulator unit, the multiplier and accumulator unit receiving weight factors stored in memory cells of the array of memory cells and inputs to estimate a sum of products of the inputs and the weight factors.

12. The device of claim 1, wherein at least one of the first and second types of synaptic layers comprises M number of memory cells in a sequence in a row of memory cells, the M number of memory cells storing a digital representation of a weight factor Wb, and wherein each memory cell in the M number of memory cells stores a weight factor $W_N$ representing a binary digit in the digital representation of the weight factor Wb.

13. The device of claim 1, wherein at least one of the synaptic layers in the plurality of synaptic layers is a third type of synaptic layer comprising a third type of memory cells, the third type of memory cells being different than the first type of memory cells and the second type of memory cells.

14. A method of manufacturing a device, comprising:
    forming a plurality of synaptic layers, at least one of the synaptic layers is a first type of synaptic layer comprising a first type of memory cells arranged for in-memory computation and at least one of the synaptic layers is a second type of synaptic layer comprising a second type of memory cells, the first type of memory cells are different than the second type of memory cells;
    wherein the first type of synaptic layer comprises a first array of memory cells configured to generate a first sum of products, based on one or more first weight factors stored in the first array of memory cells, and
    wherein the second type of synaptic layer comprises a second array of memory cells configured to generate a second sum of products, based on one or more second weight factors stored in the second array of memory cells.

15. The method of claim 14, wherein the first type of memory cells have a first structure and the second type of memory cells have a second structure, the first structure being different than the second structure, and wherein the first type of memory cell comprises a first memory material and the second type of memory cell comprises a second memory material, the first material being different than the second material.

16. The method of claim 14, further comprising:
peripheral circuitry performing write operations in the first type of memory cell with a first write algorithm and in the second type of memory cell using a second write algorithm, the first write algorithm being different than the second write algorithm, and
the peripheral circuitry further performing read operations in memory cells of the first type with a first read algorithm and in memory cells of the second type using a second read algorithm, the first read algorithm being different than the second read algorithm.

17. The method of claim 14, further comprising:
forming decoder and driver circuitry for at least one of the synaptic layers in the plurality of synaptic layers; and
forming sensing circuitry for at least one of the synaptic layers in the plurality of synaptic layers.

18. The device of claim 1, wherein:
the first type of synaptic layer comprises the first array of M by N number of memory cells storing a weight factor $W_{mn}$, where m varies from 0 to (M−1) and n varies from 0 to (N−1), the first array receiving inputs $x_m$, and outputting a sum of products of the inputs xm by respective weight factors $W_{mn}$, where m varies from 0 to (M−1) and n varies from 0 to (N−1);
the second type of synaptic layer comprises the second array of P by Q number of memory cells storing a weight factor $W_{pq}$, where p varies from 0 to (P−1) and q varies from 0 to (Q−1), the second array receiving inputs $x_p$, and outputting a sum of products of the inputs $x_p$ by respective weight factors $W_{pq}$, where p varies from 0 to (P−1) and q varies from 0 to (Q−1); and
a sum of products of one of the first and second types of synaptic layers are inputs to another one of the first and second types of synaptic layers.

19. The device of claim 1 wherein:
the second type of memory cells are arranged for in-memory computation; and
the first sum of products of the first type of synaptic layer are inputs to the second type of synaptic.

20. A device comprising:
a plurality of synaptic layers, at least one of the synaptic layers is a first type of synaptic layer comprising a first type of memory cells and at least one of the synaptic layers is a second type of synaptic layer comprising a second type of memory cells, the first type of memory cells are different than the second type of memory cells, wherein:
the first type of synaptic layer comprises a first array of memory cells storing a first plurality of weight factors, the first array receiving a first plurality of inputs, and outputting a first sum of products that is based on (i) one or more of the first plurality of weight factors and (ii) one or more of the first plurality of inputs; and
the second type of synaptic layer comprises a second array of memory cells storing a second plurality of weight factors, the second array receiving a second plurality of inputs, and outputting a second sum of products that is based on (i) one or more of the second plurality of weight factors and (ii) one or more of the second plurality of inputs.

* * * * *

UNITED STATES PATENT AND TRADEMARK OFFICE
CERTIFICATE OF CORRECTION

| | |
|---|---|
| PATENT NO. | : 11,138,497 B2 |
| APPLICATION NO. | : 16/224602 |
| DATED | : October 5, 2021 |
| INVENTOR(S) | : Yu-Hsuan Lin et al. |

It is certified that error appears in the above-identified patent and that said Letters Patent is hereby corrected as shown below:

In the Claims

In Claim 19, at Column 16, Line 12 after the word "synaptic", insert -- layer --.

Signed and Sealed this
Third Day of May, 2022

Katherine Kelly Vidal
Director of the United States Patent and Trademark Office